United States Patent [19]
Moench

[11] Patent Number: 5,581,126
[45] Date of Patent: Dec. 3, 1996

[54] INTERLACED LAYOUT CONFIGURATION FOR DIFFERENTIAL PAIRS OF INTERCONNECT LINES

[75] Inventor: Jerry D. Moench, Austin, Tex.

[73] Assignee: Advanced Micro Devices, Inc., Sunnyvale, Calif.

[21] Appl. No.: 528,030

[22] Filed: Sep. 14, 1995

[51] Int. Cl.⁶ .......................... H01L 27/10; H01L 23/48; G11C 5/06; G11C 13/00
[52] U.S. Cl. .......................... 257/776; 257/773; 257/758; 257/664; 365/207; 365/63
[58] Field of Search ........................ 257/734, 776, 257/773, 903, 920, 68, 71, 207, 206, 208, 211, 758, 664; 365/69, 63, 51, 207

[56] References Cited

U.S. PATENT DOCUMENTS

| | | | |
|---|---|---|---|
| 5,014,110 | 5/1991 | Satoh | 257/776 |
| 5,025,299 | 6/1991 | Arnould | 257/211 |
| 5,140,556 | 8/1992 | Cho et al. | 365/207 |
| 5,272,665 | 12/1993 | Uesugi | 365/63 |
| 5,280,443 | 1/1994 | Hidaka et al. | 365/207 |

FOREIGN PATENT DOCUMENTS 6-2163341  8/1994  Japan ........................ 257/68

*Primary Examiner*—Robert P. Limanek
*Assistant Examiner*—Alexander Oscar Williams
*Attorney, Agent, or Firm*—Skjerven, Morrill, MacPherson, Franklin & Friel; Andrew C. Graham

[57] ABSTRACT

An SRAM array configuration includes even bitline pairs which each laterally interchange at a crossover placed at the ½ point along the length of the bitline pairs, and which SRAM array includes odd bitline pairs which each laterally interchange at each of two associated crossovers at the ¼ and ¾ points along the length of the bitline pairs. Consequently, signals or noise resident on neighboring bitline pairs or other neighboring conductive structure couple a common-mode voltage onto a given bitline pair through lateral parasitic capacitance to the neighboring conductive structure. Such a common-mode noise signal does not affect the differential signal on the given bitline pair. This interlaced configuration is useful for one or more pairs of differential signal lines, whether used within an SRAM array or for global interconnect between circuit blocks.

22 Claims, 4 Drawing Sheets

5,581,126

INTERLACED LAYOUT CONFIGURATION FOR DIFFERENTIAL PAIRS OF INTERCONNECT LINES

BACKGROUND OF THE INVENTION

1. Field of the Invention

This invention relates to the layout of interconnect lines within integrated circuits, and more specifically relates to the layout of one or more pairs of differential signal lines upon an integrated circuit.

2. Description of Related Art

As horizontal dimensions used in the layout of integrated circuits have decreased, the affect of lateral parasitic capacitance on the loading of various interconnection lines has consequently increased. This is particularly true with long interconnections, such as are typically encountered, for example, in the array of a static RAM (SRAM). In an SRAM array, neighboring signal lines can impact the signal strength of each bitline pair due to the capacitive coupling of undesired signals from the neighboring signal lines. This can cause slow or pattern dependent access times for fully static devices or, if the data is latched, it can cause wrong data to be latched. As an example, FIG. 1 shows a small portion of a representative single port SRAM array showing one wordline (also known as a row line) and three bitline pairs. A first bitline BL10, and its corresponding complement bitline XBL10, together form the first bitline pair. Bitlines BL11 and XBL11 together form the second bitline pair, and bitlines BL12 and XLB12 form the third bitline pair. A single wordline RLX addresses three memory cells, S10, S11, and S12 which are respectively associated with bitline pairs BL10/XBL10, BL11/XBL11, and BL12/XBL12. Bitline load L10 is connected to both BL10 and XBL10 (which may also be collectively known as bitline 10). Likewise bitline load L11 and bitline load L12 are respectively connected to bitline pairs BL11/XBL11 and BL12/XBL12. Sense amp SA11, sense amp SA12 and sense amp SA13 are respectively coupled to bitline pairs BL10/XBL10, BL11/XBL11, and BL12/XBL12. A capacitor CBL10 represents the total capacitive load from bitline BL10 to all structures other than the individual bitlines adjacent to bitline BL10. Likewise, capacitor CXBL10 represents the total capacitive load on bitline XBL10 with the same exception of the capacitance to individual adjacent bitlines. The capacitance on a given bitline may be represented by a single lumped capacitor, such as capacitor CBL10, even though the total capacitance actually includes a number of individual capacitors, each connected between the bitline and a neighboring or overlapping structure. Similarly, capacitors CBL11, CXBL11, CBL12, and CXBL12 represent a corresponding capacitive load on bitlines BL11, XBL11, BL12, and XBL12, respectively. Capacitors CC1, CC2, CC3, CC4, CC5, CC6 and CC7 represent capacitive loading from a given bitline to an adjacent bitline. For example, capacitor CC3 represents the lateral parasitic capacitance between bitlines XBL10 and BL11. As a further example, capacitor CC6 represents the lateral parasitic capacitance between bitlines BL12 and XBL12. Capacitor CC1 represents the lateral parasitic capacitance between bitline BL10 and a line (not shown) running adjacent to bitline BL10. Likewise, capacitor CC7 represents a similar lateral parasitic capacitance between bitline XBL12 and a line (or other interconnection, not shown) running adjacent to bitline XBL12.

A variety of SRAM configurations are possible. For example, if the SRAM array depicted in FIG. 1 is dynamically precharged, both bitlines of a bitline pair are typically precharged high. When a wordline is enabled, one bitline, either the true or the complement bitline, is driven low by the addressed memory cell. Such a bitline is usually never driven all the way to ground potential due to the bitline load structures. In other configurations, both bitlines may equilibrate to an intermediate level and the activation of a wordline may cause one bitline to be actually driven high while the other is driven low. For the purposes of this discussion, one can generalize that for a given bitline pair, one bitline is driven high while the other is driven low whenever a memory cell is addressed by an active wordline.

Further for the purposes of this discussion, we can assume that the polarity convention of the bitlines is such that when a logic "1" is read from a memory cell, for example memory cell S10, bitline BL10 remains high or is driven high (toward VDD) and bitline XBL10 is driven low (toward VSS or ground). Conversely, when a logic "0" is read from memory cell S10, bitline XBL10 remains high and bitline BL10 is driven toward ground. This choice is entirely arbitrary but is consistent with that frequently encountered in the art. An example of the effect of neighboring signal lines on a given bitline can be seen by assuming that the memory cells S10, S11 and S12 all contain a logic "0". When wordline RLX is activated, the true bitlines BL10, BL11 and BL12 are all driven toward ground and the complement bitlines XBL10, XBL11 and XBL12 are all driven high or remain high, depending on design choices in the SRAM configuration.

In the "0", "0", "0" data pattern example described above, bitline BL11 is driven low and is surrounded by bitlines XBL10 an XBL11, both of which are driven high. Consequently, coupling capacitors CC3 and CC4 tend to impart a positive voltage transition on bitline BL11 which is opposite in direction to the low-going transition caused by the reading of the logic "0" within memory cell S11. Furthermore, bitline XBL11 is driven high by the reading of memory cell S11 and is surrounded by bitlines BL11 and BL12, which are actively driven low and which couple a negative-going voltage onto bitline XBL11. The net effect of the lateral coupling from bitlines XBL10 and BL12 into both bitlines BL11 and XBL11 tends to delay the development of the intended differential voltage conveyed on bitlines BL11 and XBL11, and thus delays the successful readout of memory cell S11. This would, of course, result in an access time penalty which is data-dependent. Such an impact is dependent upon the bitline spacings, oxide thickness, metal line thickness, the cell currents, the elapsed time, and other variables generally known in the art. These unwanted capacitive effects can either delay or advance the signal differential between bitlines BL11 and XBL11 which again further leads to pattern dependent access time. For example, if memory cells S10 and S12 each contained a logic "1", then the differential signal conveyed on bitlines BL11 and XBL11 is increased by capacitive coupling through capacitors CC3 and CC5. Such an effect is highly undesirable in a SRAM array. Further, if an array is latched, such an effect may lead to incorrect functionality rather than merely an access time dependency.

SUMMARY OF THE INVENTION

It is an object of the present invention to eliminate data pattern sensitivity in SRAM arrays due to lateral capacitive coupling from adjacent lines.

It is a further object of the present invention to eliminate any unwanted differential signal imparted upon a pair of differential interconnect lines being coupled by unrelated signals on one or more neighboring electrical structures.

These and other objects are accomplished by the current invention in which a pair of differential signal lines is laterally interchanged such that the first line of the pair is disposed adjacent to a neighboring conductive structure for a length substantially equal to a length that the second line of the pair is disposed adjacent to the neighboring conductive structure.

In one embodiment for an integrated circuit, the present invention includes a first pair of conductive interconnection lines for communicating a differential signal therebetween, said first pair comprising a first line and a second line, each disposed substantially adjacent to and parallel to the other and each fabricated substantially from a given interconnect level. A neighboring conductive structure is generally disposed adjacent to the first pair of conductive interconnection lines. The first and second lines of the pair of conductive interconnection lines laterally interchange in at least one location such that the first line is disposed adjacent to and at a given spacing from the neighboring conductive structure for a length substantially equal to a length that the second line is disposed adjacent to and at the given spacing from the neighboring conductive structure.

In a second embodiment of the current invention, an integrated circuit includes a plurality of interconnect line pairs for communicating a respective plurality of differential signals thereon, said plurality of interconnect line pairs having even-numbered interconnect line pairs and odd-numbered interconnect line pairs. Each of said odd-numbered interconnect line pairs includes (1) a first interconnect line, and a second interconnect line disposed generally parallel to, adjacent to, and at a certain spacing from the first interconnect line, said first and second interconnect lines together traversing a certain length across the integrated circuit; and (2) a first cross-over structure providing a lateral interchange of the first and second interconnect lines, thereby reversing the relative position of the first interconnect line with respect to the second interconnect line, wherein the crossover structure is disposed at a position along the first and second interconnect lines corresponding to one-half of the certain length. Each of said even-numbered interconnect line pairs includes (1) a third interconnect line, and a fourth interconnect line disposed generally parallel to, adjacent to, and at a certain spacing from the third interconnect line, said third and fourth interconnect lines together traversing across the integrated circuit for a length equal to the certain length; (2) a second cross-over structure providing a lateral interchange of the third and fourth interconnect lines, thereby reversing the relative position of the third interconnect line with respect to the fourth interconnect line, wherein the crossover structure is disposed at a position along the third and fourth interconnect lines corresponding to one-fourth of the certain length; and (3) a third cross-over structure providing a lateral interchange of the third and fourth interconnect lines, thereby reversing the relative position of the third interconnect line with respect to the fourth interconnect line, wherein the crossover structure is disposed at a position along the third and fourth interconnect lines corresponding to three-fourths of the certain length.

In another embodiment, an interconnect structure for communicating a plurality of differential signals across an integrated circuit includes a plurality of interconnect line pairs comprising even-numbered interconnect line pairs and odd-numbered interconnect line pairs, each of said plurality of interconnect line pairs traversing a certain length across the integrated circuit, each of said plurality of interconnect line pairs including a respective first interconnect line and a respective second interconnect line disposed generally parallel to, adjacent to, and at a certain spacing from the respective first interconnect line. Each of the odd-numbered interconnect line pairs includes a first cross-over disposed at a position along a respective length thereof corresponding to one-half of the certain length. Each of the even-numbered interconnect line pairs includes a second cross-over disposed at a position along a respective length thereof corresponding to one-fourth of the certain length, and further includes a third cross-over disposed at a position along a respective length thereof corresponding to three-fourths of the certain length. Each of said first, second, and third crossovers provides a lateral interchange in the relative position of the respective first and second interconnect lines.

In yet another embodiment of the current invention, an SRAM memory array within an integrated circuit includes a plurality of bitline pairs comprising even-numbered bitline pairs and odd-numbered bitline pairs, each of said plurality of bitline pairs traversing a certain length across the memory array, each of said plurality of bitline pairs comprising a respective first bitline and a respective second bitline disposed generally parallel to, adjacent to, and at a certain spacing from the respective first bitline. Each of the odd-numbered bitline pairs comprises a first cross-over disposed at a position along a respective length thereof corresponding to one-half of the certain length. Each of the even-numbered bitline pairs comprises a second cross-over disposed at a position along a respective length thereof corresponding to one-fourth of the certain length, and further comprises a third cross-over disposed at a position along a respective length thereof corresponding to three-fourths of the certain length. Each of said first, second, and third crossovers provides a lateral interchange in the relative position of the respective first and second bitlines.

DETAILED DESCRIPTION OF THE PREFERRED EMBODIMENTS

Figure 1:
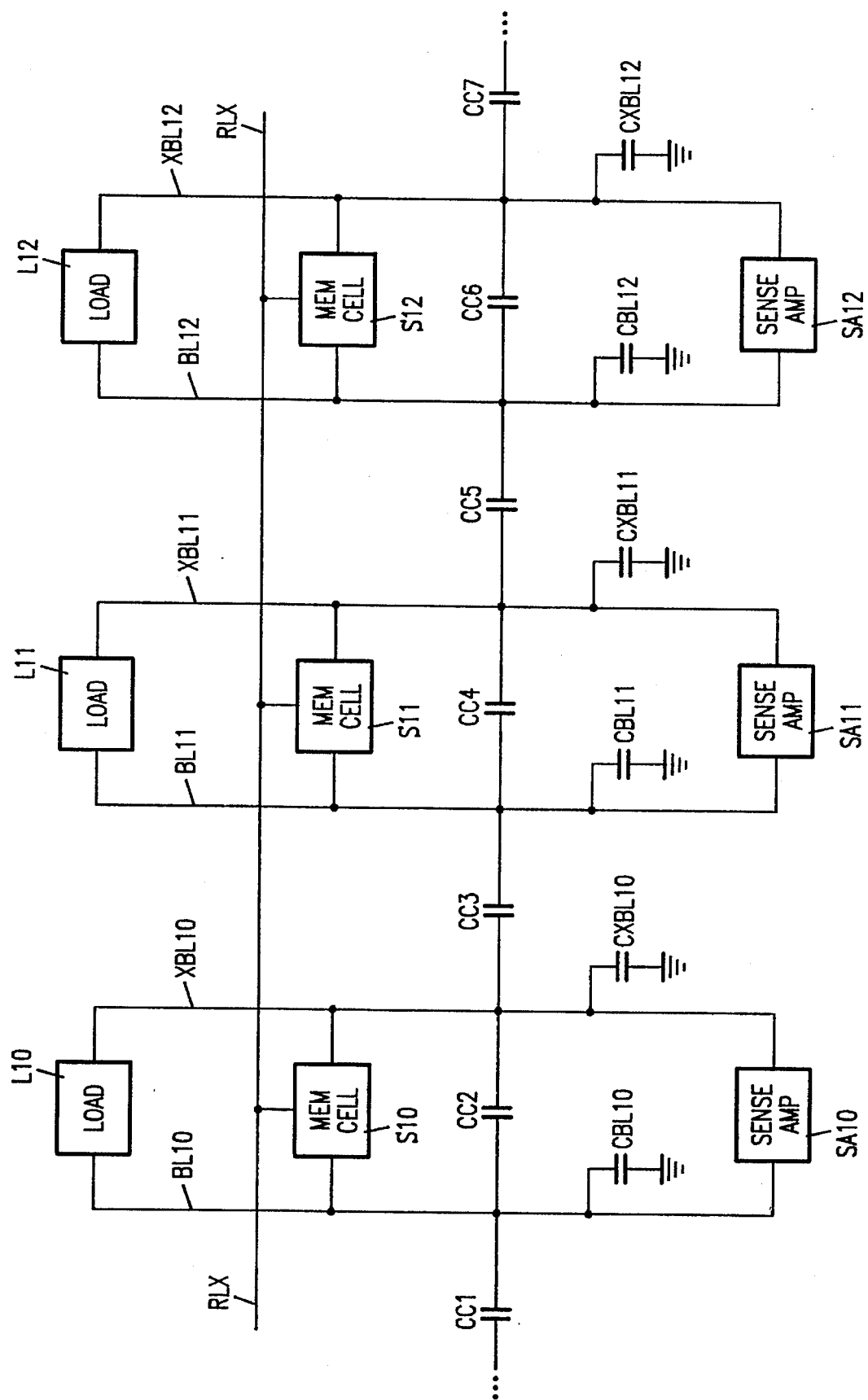
FIG. 1, labeled prior art, is a schematic diagram which illustrates a representative portion of a traditional single-port SRAM array.
Figure 2:
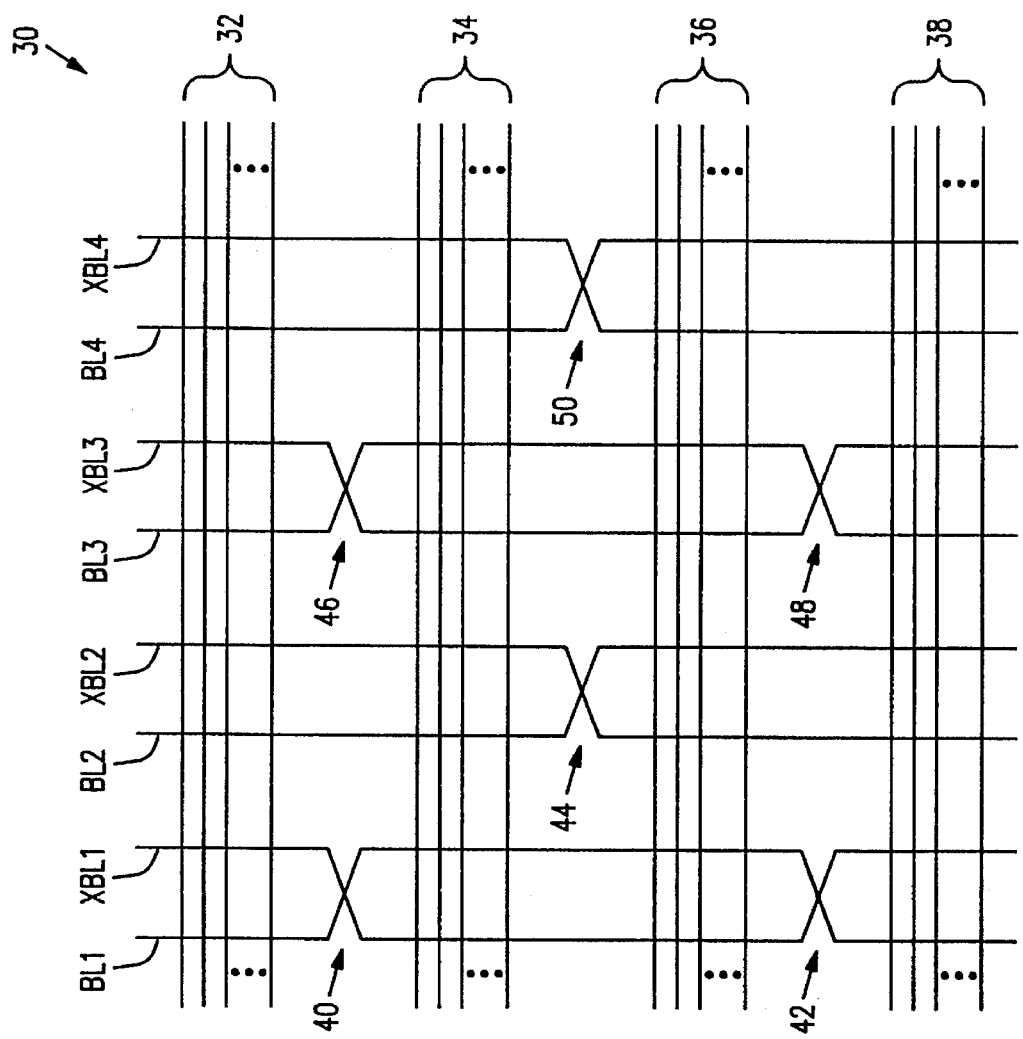
FIG. 2 is a schematic diagram which illustrates a representative portion of a single port SRAM array in accordance with the current invention.

Referring to FIG. 2, an array 30 is shown in accordance with the current invention which utilizes an interlaced bit-line configuration. The array 30 is vertically divided into 4 equal-height sections, each corresponding to a group of wordlines. Wordline groups 32, 34, 36, and 38 each preferably contain the same number of individual wordlines, each of which couples a memory cell to an associated bitline pair. For the sake of clarity, the individual memory cells are not shown, but are connected to a wordline and a bitline pair, as is well known in the art, and as is shown in FIG. 1. Further, the bitline load structures and the sense amplifiers are also not shown. Four bitline pairs are shown in FIG. 2, but it should be understood by one skilled in the art that FIG. 2 represents a structure extendable to a greater number of bitlines in an array and greater number of wordline groups.

The left-most bitline pair includes a true bitline BL1 and its associated complement bitline XBL1. These bitlines are simply referred to as bitlines BL1 and XBL1 and laterally interchange position at cross-over 40, which is positioned between wordline group 32 and wordline group 34. Such a crossover may be fabricated in a variety of ways, such as using a short length of a separate interconnect level than used for the two bitlines throughout the bulk of the array, as is well known in the art. Further, bitlines BL1 and XBL1 laterally interchange position again at cross-over 42, which is positioned between wordline group 36 and wordline group 38. Since each of the four wordline groups 32, 34, 36, and 38 contain the same number of wordlines, crossovers 40 and 42 therefore are positioned at the ¼ and ¾ points, respectively, along the length of bitlines BL1 and XBL1.

The second bitline pair (bitlines BL2 and XBL2) laterally interchanges position once at cross-over 44, which is positioned between wordline group 34 and wordline group 36. Thus, crossover 44 is positioned at the ½ point along the length of bitline BL2 and bitline XBL2. Bitlines BL3 and XBL3 laterally interchange position twice (at crossovers 46 and 48) in a similar fashion to bitlines BL1 and XBL1, and bitlines BL4 and XBL4 laterally interchange position once (at crossover 50) in a similar fashion to bitlines BL2 and XBL2.

Figure 3:
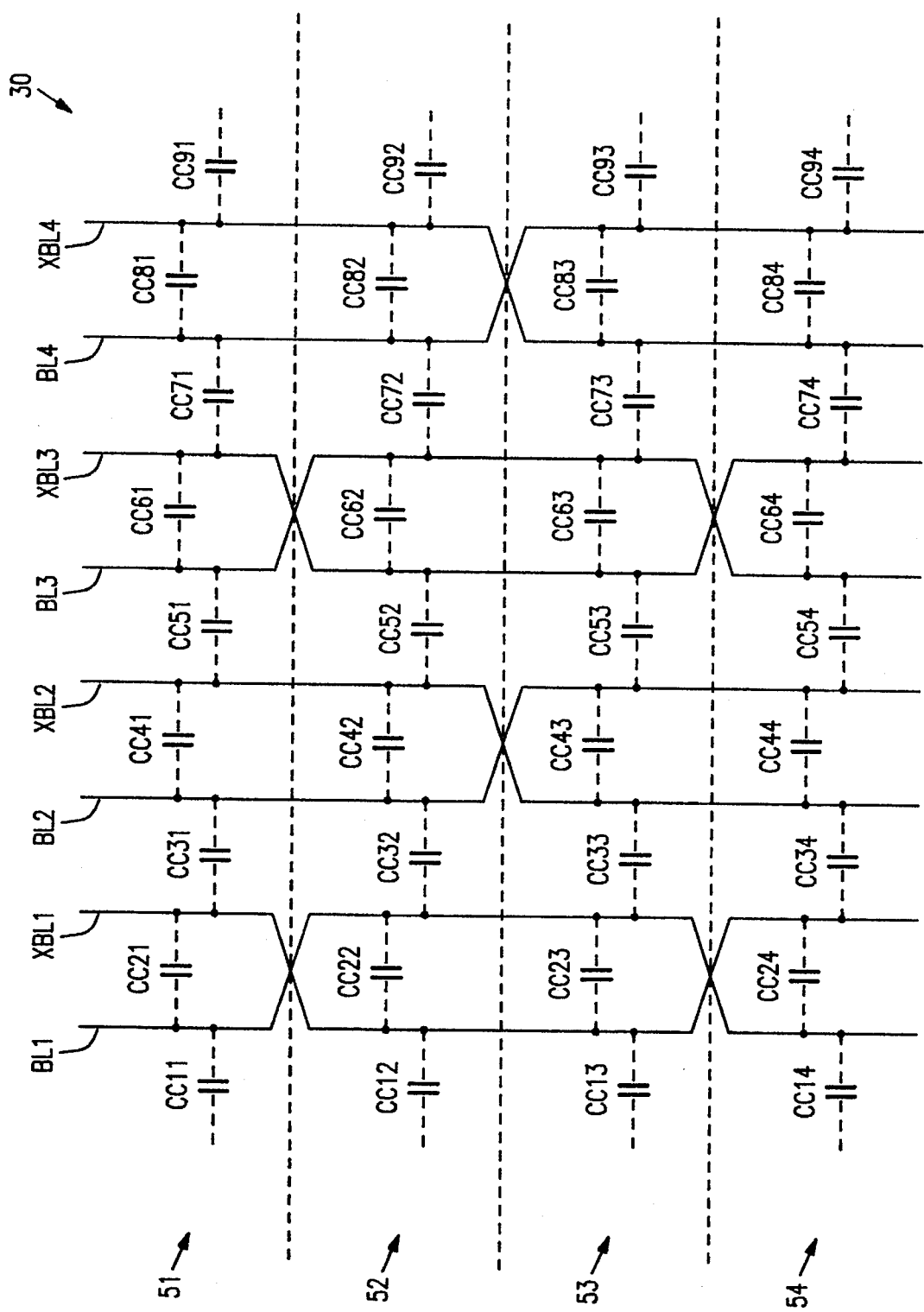
FIG. 3 is a schematic diagram which represents an additional schematic view of the array disclosed in FIG. 2.

FIG. 3 represents the same array 30 as is shown in FIG. 2 and indicates a variety of lateral parasitic capacitors between the various bitlines, but which omits the wordline groups 32, 34, 36, and 38 for the sake of clarity. Region 51 is shown corresponding to the portion of each bitline pair falling within wordline group 32. Similarly, regions 52, 53, and 54 correspond to the portions of each bitline pair falling within wordline groups 34, 36, and 38, respectively, and which also correspond to the locations of the various crossovers along the length of the bitline pairs.

Referring now to bitline BL2, capacitor CC31 represents the lateral parasitic capacitance between the portion of bitlines BL2 and XBL1 located within region 51. Such a parasitic capacitance typically results from the lateral fringing fields through a dielectric (e.g., silicon dioxide or silicon nitride) between adjacent conductors. Capacitor CC32 represents the parasitic capacitance between the respective portions of bitlines BL2 and BL1 located within region 52. Capacitor CC33 represents the lateral parasitic capacitance between the portion of bitlines XBL2 and BL1 located within region 53, and capacitor CC34 represents the lateral parasitic capacitance between the portion of bitlines XBL2 and XBL1 located within region 54. Capacitors CC51–CC54 represent the lateral parasitic capacitance between bitline pairs BL2/XBL2 and BL3/XBL3 in each of the regions 51–54 in a similar fashion as just described, as do capacitors CC71–CC74 for bitline pairs BL3/XBL3 and BL4/XBL4. Capacitors CC11–CC14 and CC91–CC94 represent lateral parasitic capacitance to adjacent bitlines (or to other structures) not shown.

Capacitor CC41 represents the parasitic capacitance between the portion of bitlines BL2 and XBL2 located within region 51. Capacitor CC42 represents the parasitic capacitance between the portion of bitlines BL2 and XBL2 located within region 52. Capacitor CC43 represents the parasitic capacitance between the portion of bitlines XBL2 and BL2 located within region 53, and capacitor CC44 represents the parasitic capacitance between the portion of bitlines XBL2 and BL2 located within region 54. Capacitors CC21–CC24 are associated similarly with bitline pair BL1/XBL1, as are capacitors CC61–CC64 to bitline pair BL3/XBL3, and as are capacitors CC81–CC84 to bitline pair BL4/XBL4.

To understand the advantages of this array 30, consider a wordline (not shown in FIG. 3) being activated during a read operation, which imparts a differential signal onto each of the bitline pairs BL1/XBL1, BL2/XBL2, BL3/XBL3, and BL4/XBL4. Any change in voltage which occurs on, for example, bitline XBL1 couples a voltage onto bitline BL2 through capacitor CC31, but also couples a voltage onto bitline XBL2 through capacitor CC34. If capacitors CC31 and CC34 are matched in size, then the magnitude of any voltage actually coupled onto bitline BL2 is equal to the voltage coupled onto bitline XBL2, and is thus a common-mode voltage to the bitline pair BL2/XBL2 and not a differential voltage. Likewise, any change in voltage which occurs on bitline BL1 couples a voltage onto bitline BL2 through capacitor CC32 and further couples a like voltage onto bitline XBL2 through capacitor CC33. With capacitors CC31, CC32, CC33, and CC34 equal in magnitude, any change in voltage on either bitlines BL1 or XBL1 equally affects both bitlines BL2 and XBL2 so that no net differential voltage is induced upon bitlines BL2/XBL2. Consequently, a differential signal developed on bitlines BL2/XBL2 by a memory cell connected thereto is not influenced by any pattern sensitivity of data read from memory cells on bitline pair BL1/XBL1. An analysis of capacitors CC51–CC54 produces an equivalent result for bitline pair BL3/XBL3. The bitline pair BL2/XBL2 is also not influenced by any pattern sensitivity of data read on bitline pair BL3/XBL3.

Similarly, one can appreciate that a differential signal developed on either bitline pair BL1/XBL1 or BL3/XBL3 by a memory cell connected respectively thereto is not influenced by any pattern sensitivity of data read on bitline pair BL2/XBL2. Capacitors CC31–CC34 are easily made equal in magnitude by matching the lateral spacing between adjacent bitline portions which form each of the parasitic capacitors CC31–CC34 and by using the same memory cell layout throughout the array.

While in most array structures useful for an SRAM the lateral parasitic capacitor CC31 is made identical to capacitor CC51 (and likewise each of capacitors CC31–CC34 is equal to capacitors CC51–CC54), the absence of pattern or speed sensitivity described above is preserved even though capacitor CC31 is not equal to capacitor CC51. So long as capacitors CC31, CC32, CC33, and CC34 are all equal in magnitude, and capacitors CC51, CC52, CC53, and CC54 are all equal in magnitude, then the above-described absence of speed and pattern sensitivity is achieved.

Figure 4:
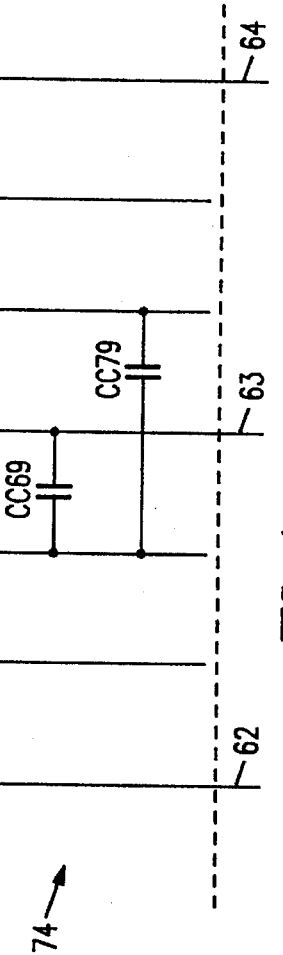
FIG. 4 is a schematic diagram which illustrates an additional embodiment of the current invention for a single port SRAM array.

Referring now to FIG. 4, an additional embodiment of the present invention shows an array having alternate VDD and VSS power supply lines running between adjacent bitline pairs. Array portion 65 includes bitline pair BL60/XBL60, which includes two crossovers similar to bitline pair BL1/XBL1 of FIGS. 2 and 3, and bitline pair BL61/XBL61 which includes a single crossover similar to bitline pair BL2/XBL2 of FIGS. 2 and 3. A VSS line 62 runs adjacent to bitline pair BL60/XBL60 (and also adjacent to a potentially neighboring bitline pair which is not shown), while a VDD line 63 runs adjacent to and between bitline pairs BL60/XBL60 and BL61/XBL61. One skilled in the art can easily recognize that such an array 65 is extendable to greater numbers of bitline pairs. For clarity, as in FIG. 3, neither the wordlines nor the memory cells are shown.

Because power lines may exhibit significant electrical noise (unwanted changes in voltage) due to dynamic currents and the non-zero inductance and resistance of integrated circuit power busses, both VSS line 62 and VDD line 63 may contain AC noise. Nonetheless, any voltage coupled onto bitline BL60 through capacitors CC67 and CC68 by AC noise on VDD line 63 is offset by an equal voltage coupled onto bitline XBL60 through capacitors CC66 and CC69, assuming, of course, that capacitors CC66, CC67, CC68, and CC69 are all equal in magnitude. Consequently, any desired differential signal arising from reading a memory cell associated with bitline pair BL60/XBL60 is unaffected by supply noise on VDD line 63. One skilled in the art can appreciate that AC noise present on VSS line 62 will also not affect the differential signal on bitline pair BL60/XBL60. Similarly, neither noise on VDD line 63 nor noise on VSS line 64 affects the differential signal arising from reading a memory cell associated with bitline pair BL61/XBL61.

Parasitic capacitive coupling can induce an unwanted signal on a given interconnect line not only from an adjacent interconnect line, but also from interconnect lines even more distant than the immediately adjacent line. For example, capacitor CC76 represents the lateral parasitic capacitance between bitlines XBL61 and XBL60 within the region 71. Similarly, capacitors CC77–CC79 represent the lateral parasitic capacitance between bitlines XBL61 and BL60 within region 72, between bitlines BL61 and BL60 within region 73, and between bitlines BL61 and XBL60 within region 74, respectively. When these capacitors CC76, CC77, CC78, and CC79 are all made equal in magnitude (for example, as when regions 71–74 each include the same number of wordlines), then the voltages coupled onto each of bitlines BL60 and XBL60 due to any change in voltage on either bitlines BL61 or XBL61 remain balanced and will not affect the desired differential voltage arising from a memory cell associated with the bitline pair BL60/XBL60.

The interlaced bitline structure discussed thus far provides a desirable structure for any differential pair of interconnect lines, not just a bitline pair as in a SRAM. Providing for one or more crossovers when running a differential line, in a similar fashion to that described above, affords protection from non-common-mode coupling from a neighboring conductive structure, whether such a structure includes other pairs of differential interconnect lines, or a power bus, or a combination thereof, and whether such a structure is adjacent to only one side of the differential pair in question, or whether a separate conductive structure is adjacent to each side of the differential pair.

Figure 5:
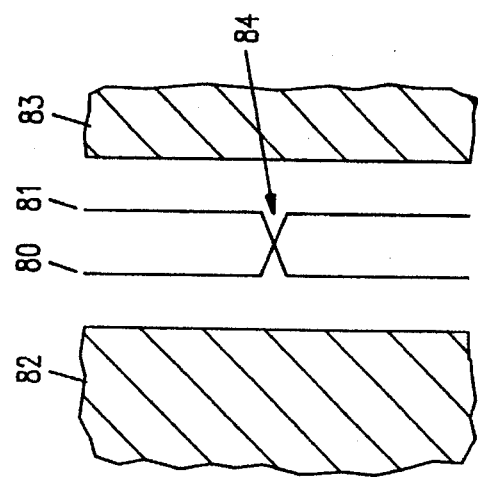
FIG. 5 is a schematic diagram which illustrates an additional embodiment of the current invention useful for a differential interconnect pair which is not necessarily related to an SRAM array.

FIG. 5 illustrates an embodiment of the present invention suitable for usage in other than an SRAM array. An interlaced pair of differential signal lines 80 and 81 are placed between power plane 82 and power plane 83. Signal lines 80 and 81 laterally interchange at crossover 84. In a similar analysis as applied above to FIG. 4, one can appreciate that any voltage coupled onto signal lines 80 or 81 from AC noise resident on either power plane 82 or 83 couples uniformly to both signal line 80 and 81, and results in a common-mode offset of the differential voltage present between signal lines 80 and 81. The differential voltage itself is not affected.

The advantages of the various array arrangements described herein are increasingly important as horizontal layout dimensions are reduced, and as lateral parasitic capacitance consequently becomes a more dominant portion of the total load capacitance on each bitline.

While the invention has been largely described with respect to the embodiments set forth above, the invention is not necessarily limited to these embodiments. For example, additional crossovers may be employed which laterally interchange each of the bitline pairs more than the one or two times per bitline pair as described herein, but which nonetheless preserve the equivalence of the total lateral parasitic capacitance between the adjacent bitline pairs, as described above. As an additional example, a neighboring conductive structure may or may not be fabricated using the same electrical interconnect level as the given differential pair in question. Moreover, while several of the embodiments have been described in the context of a SRAM array, it should be appreciated that such an array is useful for a variety of circuit blocks, such as cache memories, register files, buffers, and others, and is not merely useful for circuit blocks known commercially as "static RAMs". Accordingly, other embodiments, variations, and improvements not described herein are not necessarily excluded from the scope of the invention, which is defined by the following appended claims.

What is claimed is:

1. An interconnect structure comprising:
   a first pair of conductive interconnection lines for communicating a differential signal therebetween, said first pair comprising a first line and a second line, each disposed substantially adjacent to and parallel to the other and each fabricated substantially from a given interconnect level; and
   a neighboring conductive structure being generally disposed adjacent to the first pair of conductive interconnection lines;
   wherein the neighboring conductive structure is fabricated from the given interconnect level;
   wherein the first and second lines of the pair of conductive interconnection lines laterally interchange in at least one location such that the first line is disposed adjacent to and at a given spacing from the neighboring conductive structure for a length substantially equal to a length that the second line is disposed adjacent to and at the given spacing from the neighboring conductive structure;
   wherein the neighboring conductive structure comprises a second pair of conductive interconnection lines and a single conductive interconnect line, said second pair of conductive interconnection lines separated from the first pair of conductive interconnection lines by the single conductive interconnection line; and
   wherein the single conductive interconnect line comprises a power supply interconnect line.

2. An interconnect structure comprising:
   a plurality of interconnect line pairs for communicating a respective plurality of differential signals thereon, said plurality of interconnect line pairs having even-numbered interconnect line pairs and odd-numbered interconnect line pairs; and
   a plurality of power busses, each of which is disposed parallel to and between an even-numbered interconnect line pair and an odd-numbered interconnect line pair;
   wherein each of said odd-numbered interconnect line pairs comprises
      a first interconnect line, and a second interconnect line disposed generally parallel to, adjacent to, and at a certain spacing from the first interconnect line, said first and second interconnect lines together traversing a certain length across the integrated circuit;
      a first cross-over structure providing a lateral interchange of the first and second interconnect lines, thereby reversing the relative position of the first interconnect line with respect to the second interconnect line, wherein the first cross-over structure is disposed at a position along the first and second interconnect lines corresponding to one-half of the certain length;

wherein each of said even-numbered interconnect line pairs comprises a third interconnect line, and a fourth interconnect line disposed generally parallel to, adjacent to, and at a certain spacing from the third interconnect line, said third and fourth interconnect lines together traversing across the integrated circuit for a length equal to the certain length;

a second cross-over structure providing a lateral interchange of the third and fourth interconnect lines, thereby reversing the relative position of the third interconnect line with respect to the fourth interconnect line, wherein the second cross-over structure is disposed at a position along the third and fourth interconnect lines corresponding to one-fourth of the certain length;

a third cross-over structure providing a lateral interchange of the third and fourth interconnect lines, thereby reversing the relative position of the third interconnect line with respect to the fourth interconnect line, wherein the third cross-over structure is disposed at a position along the third and fourth interconnect lines corresponding to three-fourths of the certain length.

3. An interconnect structure for communicating a plurality of differential signals across an integrated circuit, comprising:

a plurality of interconnect line pairs comprising even-numbered interconnect line pairs and odd-numbered interconnect line pairs, each of said plurality of interconnect line pairs traversing a certain length across the integrated circuit, each of said plurality of interconnect line pairs comprising a respective first interconnect line and a respective second interconnect line disposed generally parallel to, adjacent to, and at a certain spacing from the respective first interconnect line; and a plurality of power busses, each of which is disposed generally parallel to and between an even-numbered interconnect line pair and an odd-numbered interconnect line pair;

wherein each of the odd-numbered interconnect line pairs comprises a first cross-over disposed at a position along a respective length thereof corresponding to one-half of the certain length;

wherein each of the even-numbered interconnect line pairs comprises a second cross-over disposed at a position along a respective length thereof corresponding to one-fourth of the certain length, and further comprises a third cross-over disposed at a position along a respective length thereof corresponding to three-fourths of the certain length; and wherein each of said first, second, and third crossovers provides a lateral interchange in the relative position of the respective first and second interconnect lines.

4. An interconnect structure as in claim 3 wherein the plurality of interconnect lines comprise bitlines within a memory array.

5. An interconnect structure as in claim 3 wherein the plurality of interconnect lines comprise global signal lines for communicating between circuit blocks.

6. An SRAM memory array within an integrated circuit comprising:

a plurality of bitline pairs comprising even-numbered bitline pairs and odd-numbered bitline pairs, each of said plurality of bitline pairs traversing a certain length across the memory array, each of said plurality of bitline pairs comprising a respective first bitline and a respective second bitline disposed generally parallel to, adjacent to, and at a certain spacing from the respective first bitline; and a plurality of power busses, each of which is disposed generally parallel to and between an even-numbered bitline pair and an odd-numbered bitline pair;

wherein each of the odd-numbered bitline pairs comprises a first cross-over disposed at a position along a respective length thereof corresponding to one-half of the certain length;

wherein each of the even-numbered bitline pairs comprises a second cross-over disposed at a position along a respective length thereof corresponding to one-fourth of the certain length, and further comprises a third cross-over disposed at a position along a respective length thereof corresponding to three-fourths of the certain length; and wherein each of said first, second, and third crossovers provides a lateral interchange in the relative position of the respective first and second bitlines.

7. An interconnect structure as in claim 1 wherein a substantial portion of the power supply interconnect line is fabricated from a different interconnect level than the given interconnect level.

8. An interconnect structure as in claim 2 wherein the plurality of power busses comprises alternating first power supply busses and second power supply busses.

9. An interconnect structure as in claim 2 wherein the certain length comprises but a portion of a total length of the interconnect line pairs.

10. An interconnect structure as in claim 2 wherein a substantial portion of each of the plurality of power busses is fabricated from a different interconnect level than is the plurality of interconnect line pairs.

11. An interconnect structure as in claim 3 wherein the plurality of power busses comprises alternating first power supply busses and second power supply busses.

12. An interconnect structure as in claim 3 wherein the certain length comprises but a portion of a total length of the interconnect line pairs.

13. An interconnect structure as in claim 3 wherein a substantial portion of each of the plurality of power busses is fabricated from a different interconnect level than is the plurality of interconnect line pairs.

14. An SRAM memory array as in claim 6 wherein each of the plurality of power busses comprises a first power supply bus.

15. An SRAM memory array as in claim 6 wherein the plurality of power busses comprises alternating first power supply busses and second power supply busses.

16. An interconnect structure as in claim 6 wherein a substantial portion of each of the plurality of power busses is fabricated from a different interconnect level than is the plurality of interconnect line pairs.

17. An interconnect structure comprising:

a first pair of conductive interconnection lines for communicating a differential signal therebetween, said first pair comprising a first line and a second line, each disposed substantially adjacent to and parallel to the other and each fabricated substantially from a given interconnect level;

a first power plane being generally disposed adjacent to the first pair of conductive interconnection lines; and a second power plane being generally disposed adjacent to the first pair of conductive interconnection lines and further disposed opposite the first power plane;

wherein the first and second lines of the pair of conductive interconnection lines laterally interchange in at least one location such that the first line is disposed adjacent to and at a first spacing from the first power plane for a length substantially equal to a length that the second line is disposed adjacent to and at the first spacing from the first power plane, and such that the first line is disposed adjacent to and at a second spacing from the second power plane for a length substantially equal to a length that the second line is disposed adjacent to and at the second spacing from the second power plane.

18. An interconnect structure as in claim 17 wherein the first power plane conveys a first power supply voltage and the second power plane conveys a second power supply voltage.

19. An interconnect structure for communicating a plurality of differential signals across an integrated circuit, comprising:

a plurality of interconnect line pairs comprising even-numbered interconnect line pairs and odd-numbered interconnect line pairs, each of said plurality of interconnect line pairs traversing a certain length across the integrated circuit, each of said plurality of interconnect line pairs comprising a respective first interconnect line and a respective second interconnect line disposed generally parallel to, adjacent to, and at a certain spacing from the respective first interconnect line; and a plurality of power busses, each of which is disposed generally parallel to and between an even-numbered interconnect line pair and an odd-numbered interconnect line pair;

wherein each of the odd-numbered interconnect line pairs comprises a first plurality of cross-overs disposed at a respective plurality of positions along the certain length, said first plurality of cross-overs defining a plurality of segments therebetween;

wherein each of the even-numbered interconnect line pairs comprises a second plurality of cross-overs disposed at positions along the certain length thereof corresponding to midpoints of each of the plurality of segments; and wherein each of said first and second plurality of cross-overs provides a lateral interchange in the relative position of the respective first and second interconnect lines.

20. An interconnect structure as in claim 19 wherein the plurality of power busses comprises alternating first power supply busses and second power supply busses.

21. An interconnect structure as in claim 19 wherein the certain length comprises but a portion of a total length of the interconnect line pairs.

22. An interconnect structure as in claim 19 wherein a substantial portion of each of the plurality of power busses is fabricated from a different interconnect level than is the plurality of interconnect line pairs.

\* \* \* \* \*